(12) United States Patent
Park et al.

(10) Patent No.: US 8,102,666 B2
(45) Date of Patent: Jan. 24, 2012

(54) INTEGRATED CIRCUIT PACKAGE SYSTEM

(75) Inventors: HyungSang Park, Hanam-si (KR); In Sang Yoon, Ichon-si (KR); DeokKyung Yang, Hanam-si (KR); Soo-San Park, Seoul (KR)

(73) Assignee: Stats Chippac Ltd., Singapore (SG)

( * ) Notice: Subject to any disclaimer, the term of this patent is extended or adjusted under 35 U.S.C. 154(b) by 819 days.

(21) Appl. No.: 12/194,506

(22) Filed: Aug. 19, 2008

(65) Prior Publication Data

US 2010/0046183 A1 Feb. 25, 2010

(51) Int. Cl.
*H01L 23/02* (2006.01)

(52) U.S. Cl. ........ 361/767; 361/760; 361/790; 257/673; 257/686; 257/678; 257/680; 257/724; 257/777; 257/786; 174/260; 438/106; 438/107; 438/108

(58) Field of Classification Search .......... 361/760–767, 361/735, 752, 790–794; 174/250–267; 438/106–113, 116–118, 121–126; 257/680, 257/685–693, 700–724, 730, 733, 776–779, 257/698, 787, E23.001, E23.194, E25.005, 257/E25.006, E25.021, E25.027, E23.085

See application file for complete search history.

(56) References Cited

U.S. PATENT DOCUMENTS

| | | | | |
|---|---|---|---|---|
| 5,012,323 | A * | 4/1991 | Farnworth | 257/723 |
| 5,422,435 | A * | 6/1995 | Takiar et al. | 174/521 |
| 6,469,376 | B2 | 10/2002 | Vaiyapuri | |
| 6,507,098 | B1 | 1/2003 | Lo et al. | |
| 6,773,960 | B2 * | 8/2004 | Fee et al. | 438/110 |
| 6,818,474 | B2 | 11/2004 | Kim et al. | |
| 6,841,870 | B2 | 1/2005 | Misumi | |
| 6,856,009 | B2 * | 2/2005 | Bolken et al. | 257/686 |
| 6,870,247 | B2 * | 3/2005 | Fee et al. | 257/680 |
| 7,005,316 | B2 * | 2/2006 | Lee et al. | 438/106 |
| 7,045,892 | B2 | 5/2006 | Kyung | |
| 7,078,823 | B2 * | 7/2006 | Thurgood | 257/786 |
| 7,102,217 | B2 * | 9/2006 | Thurgood | 257/673 |
| 7,198,980 | B2 * | 4/2007 | Jiang et al. | 438/107 |
| 7,279,786 | B2 * | 10/2007 | Kim | 257/686 |
| 7,800,212 | B2 * | 9/2010 | Yoon et al. | 257/686 |
| 2008/0185719 | A1 * | 8/2008 | Cablao et al. | 257/738 |

\* cited by examiner

*Primary Examiner* — Michail V Datskovskiy (74) *Attorney, Agent, or Firm* — Mikio Ishimaru (57) ABSTRACT

An integrated circuit package system includes: connecting a carrier and an integrated circuit mounted thereover; mounting an interposer, having an opening, over the integrated circuit; connecting an interconnect between the interposer and the carrier through the opening; and forming an encapsulation planar with a carrier vertical side of the carrier and an interposer vertical side of the interposer.

10 Claims, 6 Drawing Sheets

INTEGRATED CIRCUIT PACKAGE SYSTEM

TECHNICAL FIELD

The present invention relates generally to an integrated circuit package system and more particularly to a dual sided integrated circuit package system.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP).

The drumbeat of miniaturization is relentless, hence there is a constant need to improve the POP and PIP approaches to packaging to reduce the vertical profile, as well as conserve motherboard real estate. One of the side effects of fitting a large number of transistors on a single die, and fitting multiple dice in a package, is the increased number of required interconnects. Higher density connections are required to access the functionality of a given chip.

Thus, a need still remains for an integrated circuit package system providing a reduced use of board real estate and reduced vertical profile. In view of the ever-increasing need to save costs and miniaturizations, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: connecting a carrier and an integrated circuit mounted thereover; mounting an interposer, having an opening, over the integrated circuit; connecting an interconnect between the interposer and the carrier through the opening; and forming an encapsulation planar with a carrier vertical side of the carrier and an interposer vertical side of the interposer.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Figure 1:
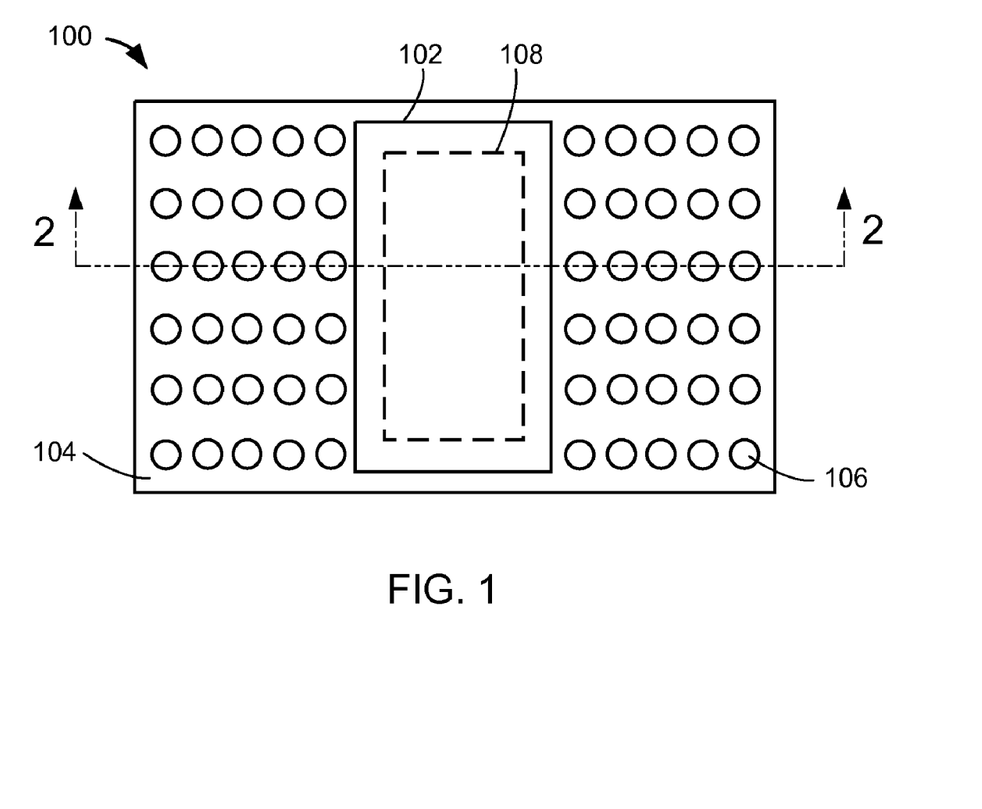
FIG. 1 is a top view of an integrated circuit package system in a first embodiment of the present invention.

Referring now to FIG. 1, therein is shown a top view of an integrated circuit package system 100 in a first embodiment of the present invention. The top view depicts an interposer 104 having an opening 108. The interposer 104, such as a laminate substrate, includes contact pads 106, such as interconnect sites. The opening 108 is depicted by a dotted rectangle under an encapsulation protrusion 102, such as a protrusion including an epoxy molding compound. The encapsulation protrusion 102 is larger than the opening 108.

Figure 2:
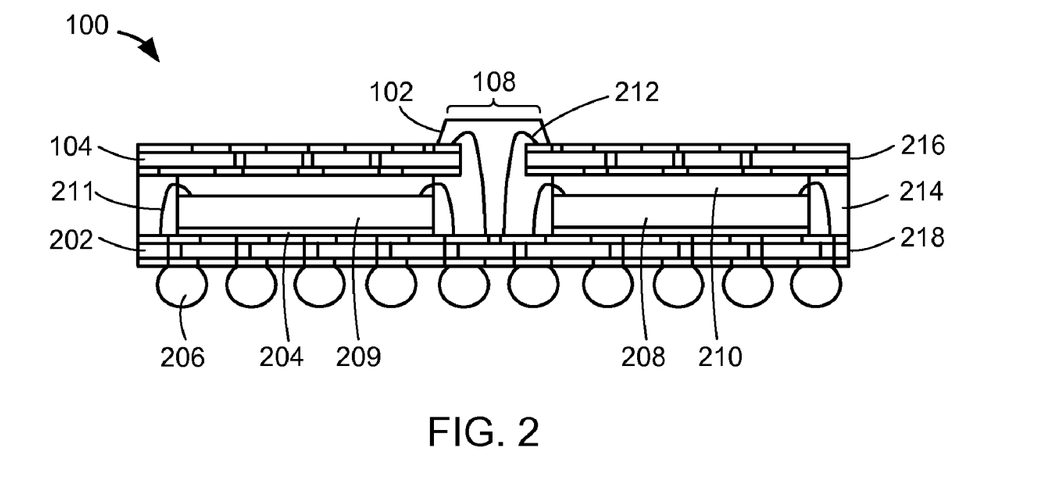
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. A first integrated circuit 208, such as an integrated circuit die, and a second integrated circuit 209, such as an integrated circuit die, can attach over a carrier 202, such as a laminated substrate, by an adhesive 204, such as a die-attach adhesive. The carrier 202 can include external interconnects 206, such as solder balls. The first integrated circuit 208 and the second integrated circuit 209 can be mounted adjacent to one another with a space between them. The first integrated circuit 208 and the carrier 202 as well as the second integrated circuit 209 and the carrier 202 can be connected with first interconnects 211.

The interposer 104 can be positioned with the opening 108 above the space between the first integrated circuit 208 and the second integrated circuit 209. A spacer 210 can be used to attach the interposer 104 over first integrated circuit 208 and the second integrated circuit 209. The spacer 210 can be an epoxy paste or a wire-in-film B-stage penetrable material that can be preformed by printing, laminating, or coating.

The interposer 104 and the carrier 202 can be connected by second interconnects 212, such as bond wires or ribbon wires, through the opening 108. An encapsulation 214, such as epoxy molding compound, having the encapsulation protrusion 102 fills the voids left between the carrier 202, the first integrated circuit 208, the second integrated circuit 209, the spacer 210, and the interposer 104. The encapsulation 214 can be planar with an interposer vertical side 216 of the interposer 104 and a carrier vertical side 218 of the carrier 202.

The encapsulation protrusion 102 can be formed through the opening 108. The encapsulation protrusion 102 can extend over the interposer 104 adjacent to the opening 108 and seals the second interconnects 212. The encapsulation protrusion 102 can provide a stand off height above the interposer 104.

It has been discovered that the present invention provides an integrated circuit package system with a reduced vertical profile and a reduced cost by minimizing the amount of material used for encapsulation. The reduced vertical profile can be achieved with the encapsulation protrusion without requiring a separate encapsulation. The reduction of the encapsulation material is due to a partially exposed interposer and an encapsulation planar with a carrier vertical side of the carrier and interposer vertical side of the interposer, an approach that also simplifies the mold used in the encapsulation.

It has also been discovered that the present invention provides an integrated circuit package system with reduced usage of board real estate by increasing integration density through an interposer with exposed interconnect sites. The encapsulation is planar with the vertical sides of the interposer and the carrier.

It has also been discovered that the present invention provides an integrated circuit package system with increased manufacturing yield by routing interconnects through the interposer opening, which prevents potential wire sweep failure. Exposed interposer interconnect sites obviate the need for a pre-encapsulated mold cap for interconnects and its associated problems of having large pitch size as well as large diameter solder balls in order to clear the pre-encapsulated mold cap for the interconnects.

Figure 3:
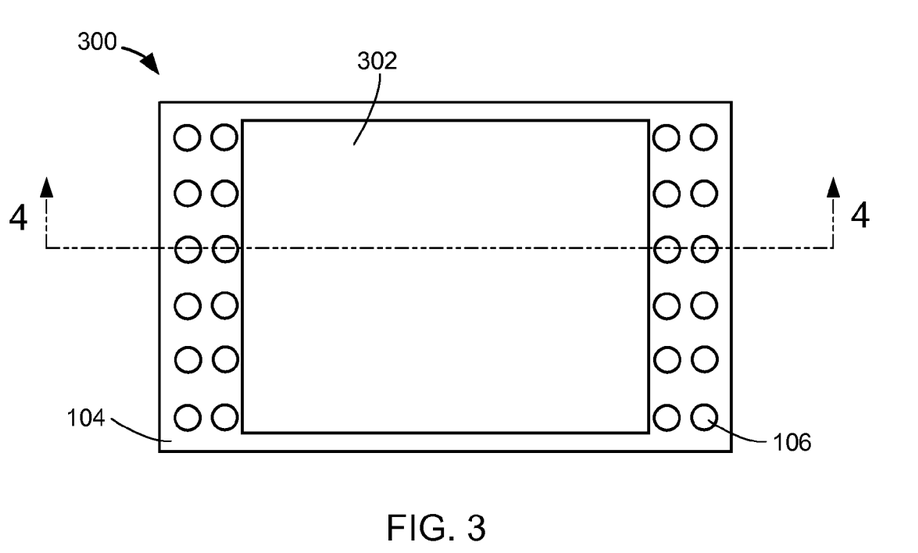
FIG. 3 is a top view of an integrated circuit package-on-package system in a first application example of the integrated circuit package system of FIG. 2.

Referring now to FIG. 3, is a top view of an integrated circuit package-on-package system 300 in a first application example of the integrated circuit package system 100 of FIG. 2. The top view depicts a device 302, such as an integrated circuit package system, mounted above the interposer 104.

For illustrative purposes, the integrated circuit package-on-package system 300 is shown with the device 302 having dimensions smaller than that of the interposer 104, exposing some of the contact pads 106. It is understood that the device 302 can have a different geometric configuration. For example, the device 302 can have dimensions larger than that of the interposer 104.

Figure 4:
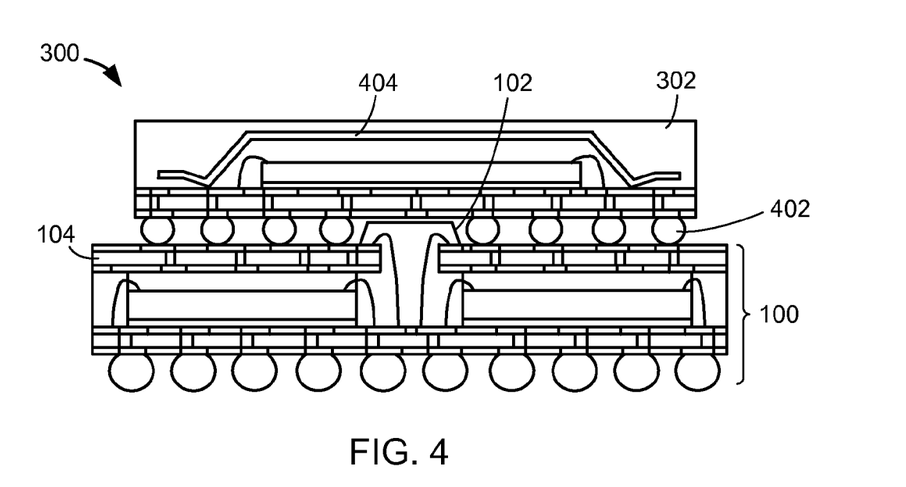
FIG. 4 is a cross-sectional view of the integrated circuit package-on-package system along line 4-4 of FIG. 3.

Referring now to FIG. 4, therein is shown a cross-sectional view of the integrated circuit package-on-package system 300 along a line 4-4 of FIG. 3. The device 302 can be over the interposer 104. The device 302 can integrate a thermal structure 404, such as a heat sink. The interposer 104 can connect to the device 302 with intra-interconnects 402, such as solder balls. The encapsulation protrusion 102 can provide a stand off height for the device 302.

Figure 5:
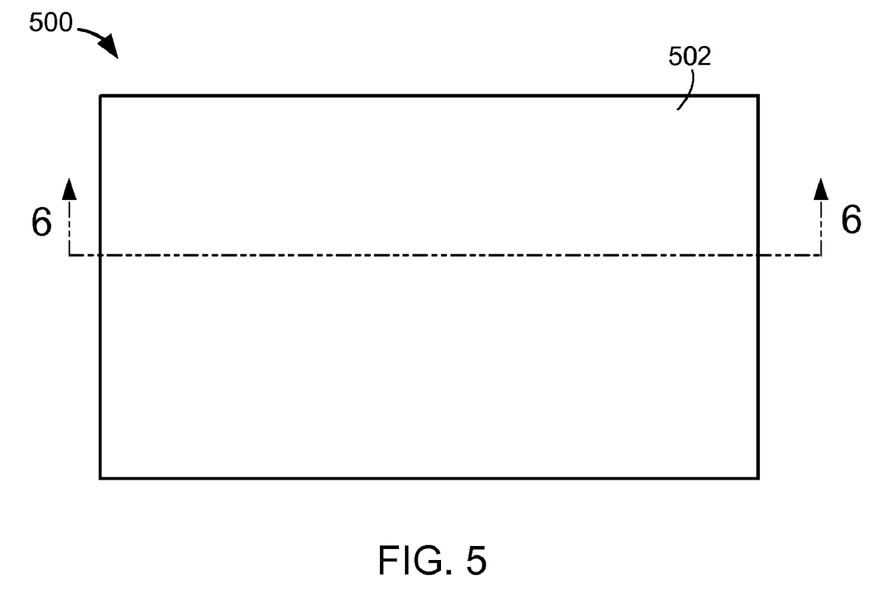
FIG. 5 is a top view of an integrated circuit package-on-package system in a second application example of the integrated circuit package system of FIG. 2.

Referring now to FIG. 5, therein is shown a top view of an integrated circuit package-on-package system 500 in a second application example of the integrated circuit package system 100 of FIG. 2. The integrated circuit package-on-package system 500 includes a thermal structure 502, such as a heat sink.

Figure 6:
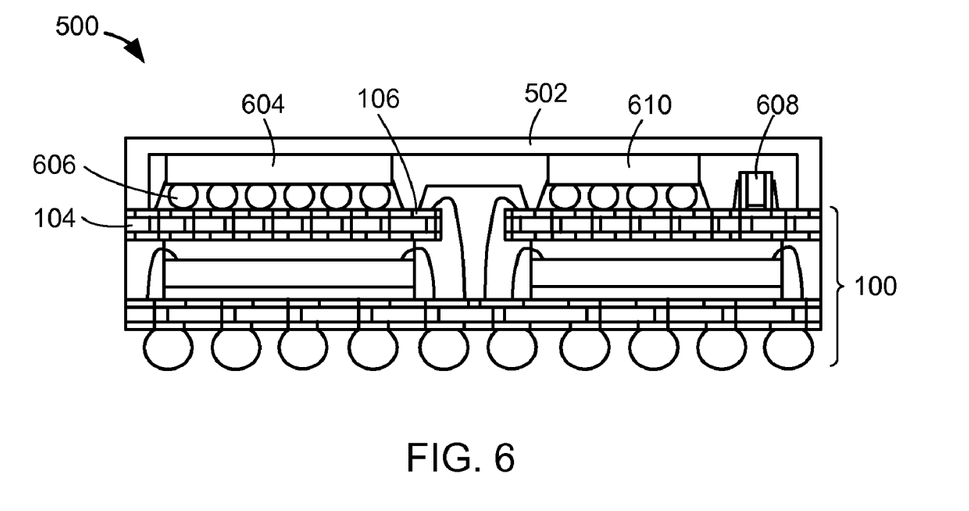
FIG. 6 is a cross-sectional view of the integrated circuit package-on-package system along line 6-6 of FIG. 5.

Referring now to FIG. 6 is a cross-sectional view of the integrated circuit package-on-package system 500 along line 6-6 of FIG. 5. A first device 604, such as a flip chip, and a second device 610, such as flip chip, can mount over the interposer 104. The first device 604 and the second device 610 can connect to the contact pads 106 of the interposer 104 by intra-interconnects 606, such as solder bumps.

A third device 608, such as a passive component, can be mounted over the interposer 104. The integrated circuit package-on-package system 500 can include the first device 604, the second device 610, the third device 608, and the integrated circuit package system 100. The integrated circuit package-on-package system 500 can also include the thermal structure 502 over the first device 604, the second device 610, the third device 608, and the integrated circuit package system 100. Thermal conduction material (not shown), such as thermal adhesive, can be optionally applied between the thermal structure 502 and both the first devices 604 and the second device 610.

Figure 7:
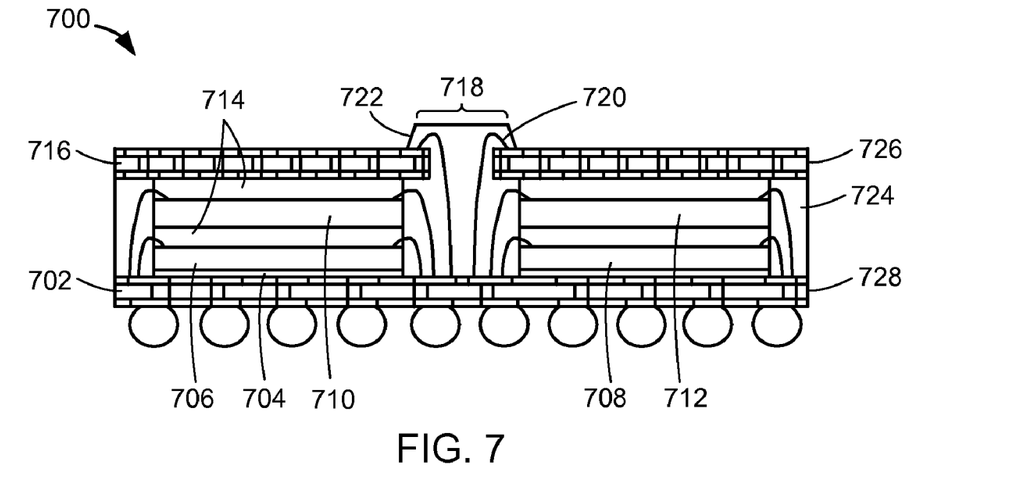
FIG. 7 is a cross-sectional view of an integrated circuit package system exemplified by the top view along 2-2 of FIG. 1 in a second embodiment of the present invention.

Referring now to FIG. 7 is a cross-sectional view of an integrated circuit package system 700 exemplified by the top view along 2-2 of FIG. 1 in a second embodiment of the present invention. A first integrated circuit 706, such as an integrated circuit die, and a second integrated circuit 708, such as an integrated circuit die, can be mounted over a carrier 702, such as a laminated substrate with, with an adhesive 704, such as die-attach adhesive. The first integrated circuit 706, and the second integrated circuit 708 can be positioned adjacent to each other with a space between them. A third integrated circuit 710, such as an integrated circuit die, and a fourth integrated circuit 712, such as an integrated circuit die, can be mounted over the first integrated circuit 706 and the second integrated circuit 708, respectively, with a spacer 714, such as a wire-in-film adhesive.

An interposer 716 can be positioned such that an opening 718 is over the space. The interposer 716 having the opening 718 can be mounted over the third integrated circuit 710 and the fourth integrated circuit 712 with the spacer 714.

The interposer 716 and the carrier 702 can be connected by interconnects 720, such as bond wires or ribbon wires, through the opening 718. An encapsulation 724, such as a cover including an epoxy molding compound, having an encapsulation protrusion 722 can fill the voids between the carrier 702, the first integrated circuit 706, the second integrated circuit 708, the third integrated circuit 710, the fourth integrated circuit 712, the spacer 714, and the interposer 716. The encapsulation 724 can be planar with an interposer vertical side 726 of the interposer 716 and a carrier vertical side 728 of the carrier 702.

The encapsulation protrusion 722 can be formed through the opening 718. The encapsulation protrusion 722 extends over the interposer 716 adjacent to the opening 718 and seals the interconnects 720. The encapsulation protrusion 722 can provide a stand off height above the interposer 716.

Figure 8:
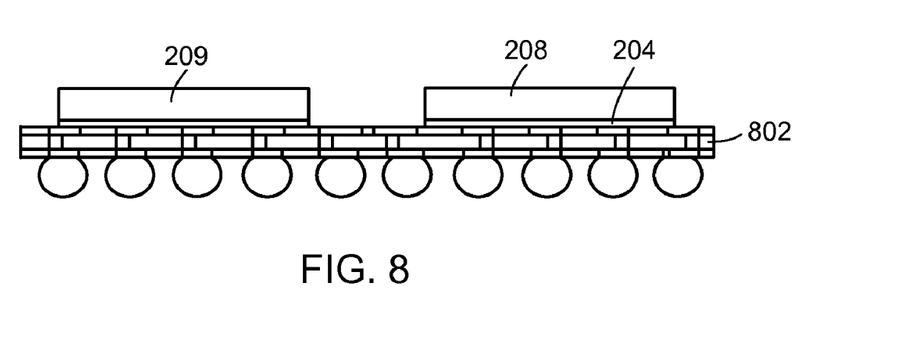
FIG. 8 is a cross-sectional view of a carrier structure with the first integrated circuit and the second integrated circuit thereover.

Referring now to FIG. 8, therein is shown a cross-sectional view of a carrier structure 802 with the first integrated circuit 208 and the second integrated circuit 209 thereover. The first integrated circuit 208 and the second integrated circuit 209 can be attached over the carrier structure 802 with the adhesive 204. The first integrated circuit 208 and the second integrated circuit 209 can be positioned adjacent to each other with the space between them. The structure of FIG. 8 can undergo curing to activate the adhesive 204 to form a mechanical bond between both the first integrated circuit 208 and the second integrated circuit 209 and with the carrier structure 802.

Figure 9:
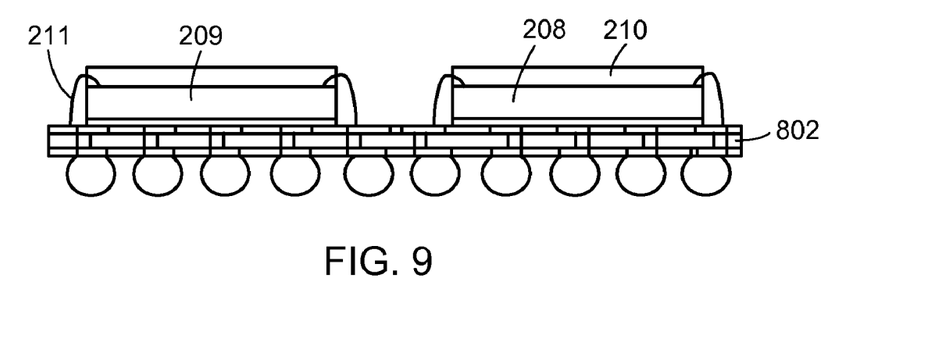
FIG. 9 is the structure of FIG. 8 in applying the spacer.

Referring now to FIG. 9 is the structure of FIG. 8 in applying the spacer 210. The first integrated circuit 208 and the second integrated circuit 209 are connected to the carrier structure 802 with the first interconnects 211. The spacer 210 can be applied over the first integrated circuit 208 and the second integrated circuit 209. The spacer 210 surrounds a portion of the first interconnects 211 adjacent to the connection sites with the first integrated circuit 208 and the second integrated circuit 209.

Figure 10:
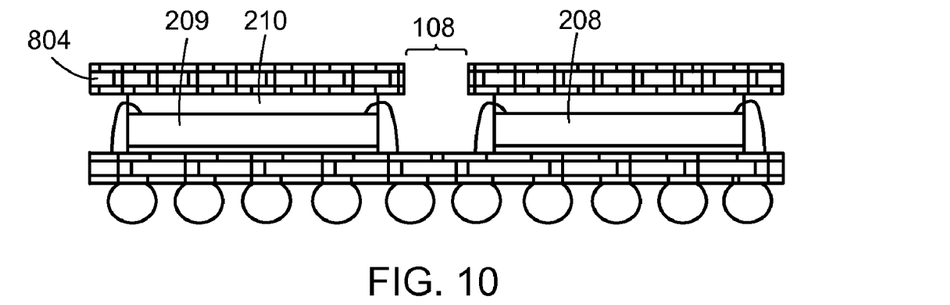
FIG. 10 is the structure of FIG. 9 in mounting an interposer structure having the opening.

Referring now to FIG. 10, therein is shown the structure of FIG. 9 in mounting an interposer structure 804 having the opening 108. The interposer structure 804 can be positioned with the opening 108 is over the space between the first integrated circuit 208 and the second integrated circuit 209. The interposer structure 804 can be attached to the first integrated circuit 208 and the second integrated circuit 209 with the spacer 210.

Figure 11:
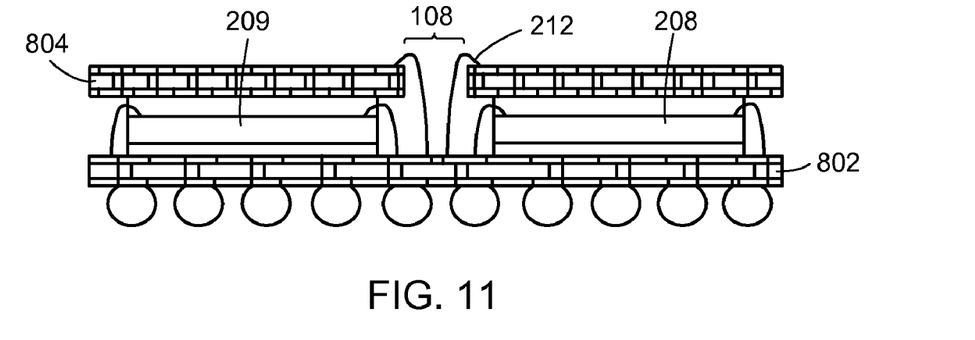
FIG. 11 is the structure of FIG. 10 in connecting the carrier structure and the interposer structure through the opening.

Referring now to FIG. 11 therein is shown the structure of FIG. 10 in connecting the carrier structure 802 and the interposer structure 804 through the opening 108. The interposer structure 804 and the carrier structure 802 can be connected with the second interconnects 212 through the opening 108. The second interconnects 212 can connect with the carrier structure 802 at the space between the fist integrated circuit 208 and the second integrated circuit 209.

Figure 12:
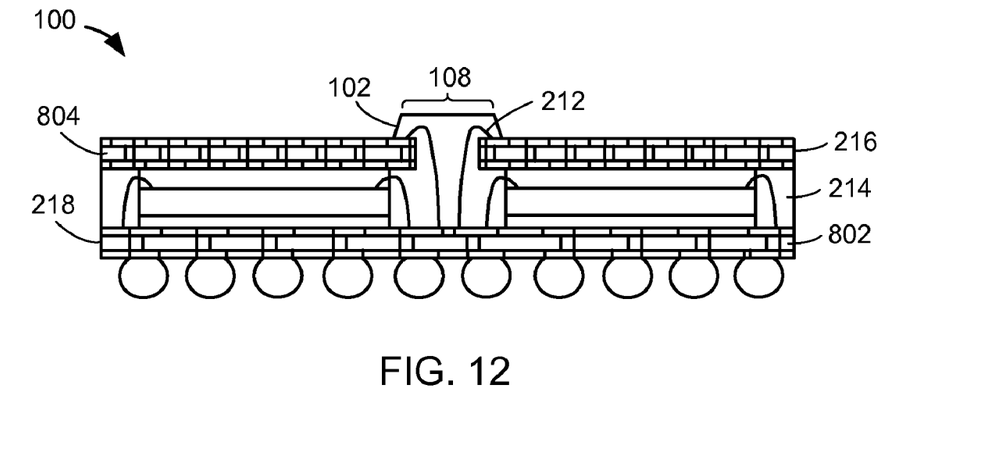
FIG. 12 is the structure of FIG. 11 in encapsulating the integrated circuit package system of FIG. 2.

Referring now to FIG. 12, therein is shown the structure of FIG. 11 in encapsulating the integrated circuit package system 100 of FIG. 2. The structure of FIG. 11 can undergo an encapsulating process such that a portion of a top side of the interposer structure 804 is exposed. The encapsulation 214 can be planar with the interposer vertical side 216 of the interposer structure 804 and the carrier vertical side 218 of the carrier structure 802.

The encapsulation 214 can penetrate the opening 108 forming the encapsulation protrusion 102 above the interposer structure 804. The encapsulation protrusion 102 extends over the interposer structure 804 adjacent to the opening 108 and encloses the second interconnects 212. The structure with the encapsulation 214 can undergo singulation forming the integrated circuit package system 100.

Figure 13:
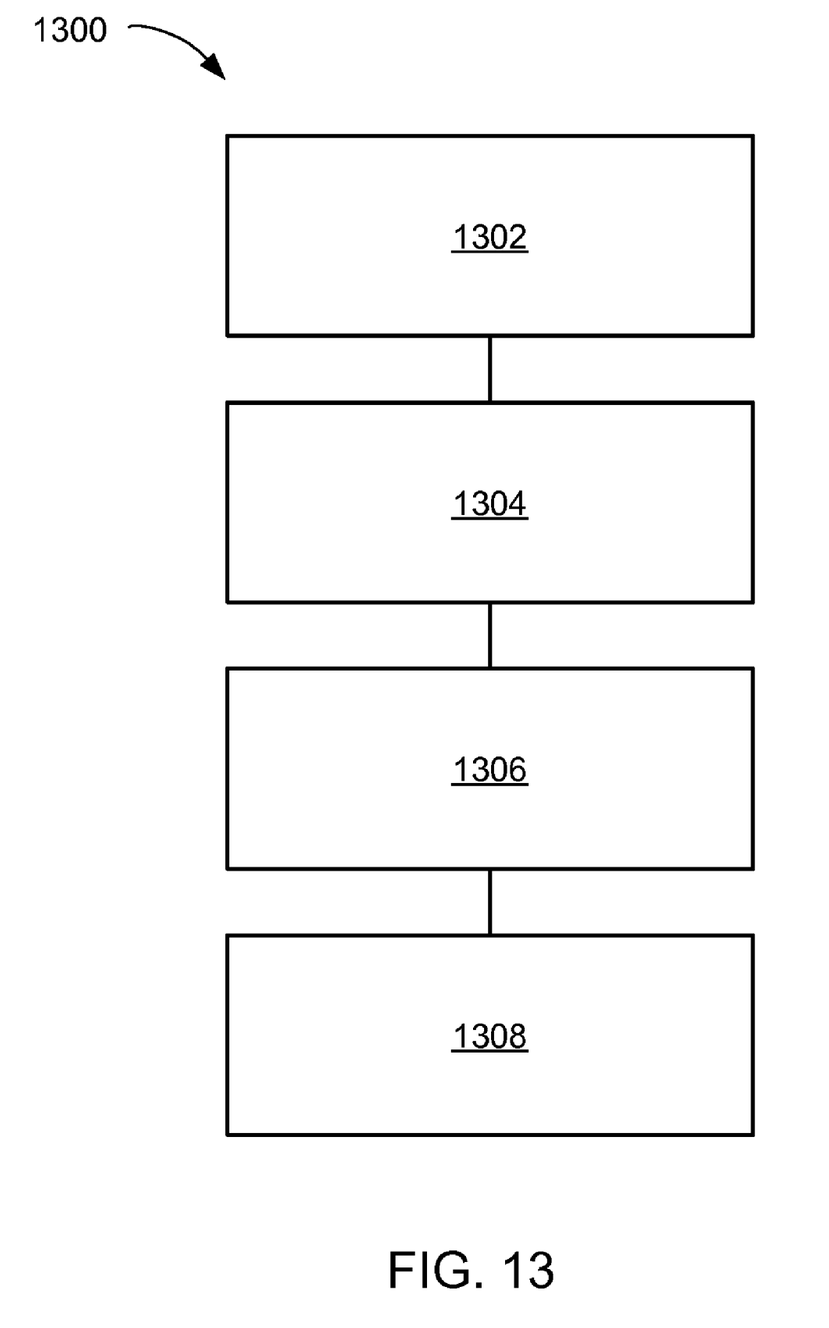
FIG. 13 is a flow chart of an integrated circuit package system for manufacture of the integrated circuit package system in an embodiment of the present invention.

Referring now to FIG. 13, therein is shown a flow chart of an integrated circuit package system 1300 for manufacture of the integrated circuit package system 100 in an embodiment of the present invention. The system 1300 includes connecting a carrier and an integrated circuit mounted thereover in a block 1302; mounting an interposer, having an opening, over the integrated circuit in a block 1304; connecting an interconnect between the interposer and the carrier through the opening in a block 1306; and forming an encapsulation planar with a carrier vertical side of the carrier and an interposer vertical side of the interposer in a block 1308.

Yet other important aspects of the embodiments include that it valuably supports and services the historical trend of reducing costs, simplifying systems, and increasing performance. These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
   a carrier;
   an integrated circuit over the carrier;
   an interposer, having an opening, over the integrated circuit;
   an interconnect between the interposer having the opening and the carrier through the opening; and
   an encapsulation planar with a carrier vertical side of the carrier and an interposer vertical side of the interposer.

2. The system as claimed in claim 1 wherein the interposer includes a contact pad exposed from the encapsulation.

3. The system as claimed in claim 1 wherein the encapsulation includes an encapsulation protrusion above the opening of the interposer.

4. The system as claimed in claim 1 further comprising a thermal structure over the interposer.

5. The system as claimed in claim 1 further comprising a device over the interposer.

6. The system as claimed in claim 1 further comprising a spacer between the integrated circuit and the interposer.

7. The system as claimed in claim 6 wherein the encapsulation includes an encapsulation protrusion through the opening and over the interconnect.

8. The system as claimed in claim 6 wherein the integrated circuit includes a stack of integrated circuits.

9. The system as claimed in claim 6 wherein the spacer includes a wire-in-film B-stage penetrable material.

10. The system as claimed in claim 6 wherein the spacer is over a portion of a first interconnect adjacent to a connection with the integrated circuit.

* * * * *